(12) United States Patent
Girard Desprolet et al.

(10) Patent No.: US 9,810,823 B2
(45) Date of Patent: Nov. 7, 2017

(54) PLASMONIC FILTER

(71) Applicants: STMicroelectronics SA, Montrouge (FR); STMicroelectronics (Crolles 2) SAS, Crolles (FR); Commissariat A L'Energie Atomique et aux Energies Alternatives, Paris (FR)

(72) Inventors: Romain Girard Desprolet, Grenoble (FR); Sandrine Lhostis, Thonon les Bains (FR); Salim Boutami, Grenoble (FR)

(73) Assignees: STMicroelectronics (Crolles 2) SAS, Crolles (FR); STMicroelectronics SA, Montrouge (FR); Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 15/357,871

(22) Filed: Nov. 21, 2016

(65) Prior Publication Data

US 2017/0153367 A1 Jun. 1, 2017

(30) Foreign Application Priority Data

Nov. 27, 2015 (FR) ..................... 15 61454

(51) Int. Cl.
*H01Q 15/02* (2006.01)
*G02B 5/20* (2006.01)
*H01L 27/146* (2006.01)

(52) U.S. Cl.
CPC .............. *G02B 5/208* (2013.01); *G02B 5/204* (2013.01); *H01L 27/1462* (2013.01);
(Continued)

(58) Field of Classification Search
CPC .... H01Q 15/0013; H01Q 15/12; G02B 5/204; G02B 5/208
See application file for complete search history.

(56) References Cited

U.S. PATENT DOCUMENTS 4,652,891 A * 3/1987 Bossuet ................. H01Q 15/12
343/756
4,656,487 A * 4/1987 Sureau ............... H01Q 15/0013
343/872
(Continued)

FOREIGN PATENT DOCUMENTS

| WO | WO-2010029097 A1 | 3/2010 |
| WO | WO-2010073543 A1 | 7/2010 |
| WO | WO-2014083326 A1 | 6/2014 |

OTHER PUBLICATIONS

Dong Jie et al: "Tunable terahertz plasmonic filter based on a substrate of photo-induced phase-transition vanadium dioxide film", Optomechatronic Micro/Nano Devices and Components III : Oct. 8-10, 2007, Lausanne, Switzerland; [Proceedings of SPIE, ISSN 0277-786X], SPIE, Bellingham, Wash, vol. 9233, Jul. 14, 2014.
(Continued)

*Primary Examiner* — Jaehwan Oh
(74) *Attorney, Agent, or Firm* — Gardere Wynne Sewell LLP

(57) ABSTRACT

An infrared high-pass plasmonic filter includes a copper layer interposed between two layers of a dielectric material. An array of patterned openings extend through the copper layer and are filled with the dielectric material. Each patterned opening is in the shape of a greek cross, with the arms of adjacent patterns being collinear. A ratio of the width to the length of each arm is in the range from 0.3 to 0.6, and the distance separating the opposite ends of arms of adjacent patterns is shorter than 10 nm.

20 Claims, 4 Drawing Sheets

(52) U.S. Cl.
    CPC .. *H01L 27/14621* (2013.01); *H01L 27/14645* (2013.01); *H01L 27/14649* (2013.01)

(56) References Cited

U.S. PATENT DOCUMENTS 5,400,043 A * 3/1995 Arceneaux ............. H01Q 1/421
                                                  343/872
5,917,458 A * 6/1999 Ho ........................ H01Q 1/405
                                                  343/769

OTHER PUBLICATIONS

Girard-Desprolet Romain et al: "Impact of process factors on the performance of hole array metallic filters", Applied Physics A: Materials Science § Processing, Springer International, DE, vol. 117, No. 2, Sep. 4, 2014, pp. 485-490, XP035404792, ISSN: 0947-8396.
INPI Search Report and Written Opinion for FR 1561454 dated Jun. 24, 2016 (9 pages).

* cited by examiner

PLASMONIC FILTER

PRIORITY CLAIM

This application claims the priority benefit of French Application for Patent No. 1561454, filed on Nov. 27, 2015, the disclosure of which is hereby incorporated by reference in its entirety to the maximum extent allowable by law.

TECHNICAL FIELD

The present disclosure relates to a high-pass type plasmonic filter capable of letting infrared light pass and of blocking visible light.

BACKGROUND

Plasmonic filters comprise a pattern made of a dielectric material extending through a metal layer or conversely, the pattern being generally periodically repeated in the layer.

Patent application WO 2010/029097 (incorporated by reference) describes an example of a plasmonic filter comprising a cross-shaped pattern made of a dielectric material periodically repeated in a metal layer. This filter is of narrow bandpass type, that it, the wavelength range for which the filter enables more than 50% of the received light to pass has a width smaller than some hundred nanometers.

In certain applications, particularly in the field of image sensors, when a high-pass filter blocking visible light and transparent to infrared light is desired to be formed, a layer of a material, currently called black resin, absorbing visible light and transparent to infrared light is used. However, the use of black resin raises various issues, particularly due to the fact that black resin is altered when submitted to temperatures higher than 250° C., which makes the forming of other structures implying thermal treatments difficult once the black resin has been deposited. Further, it is difficult to delimit black resin on small surfaces corresponding to elementary pixels.

It would thus be desirable to have a high-pass filter transparent to infrared light and blocking visible light, which uses no absorbing layer of black resin type.

SUMMARY

An embodiment provides an infrared high-pass plasmonic filter comprising, through a copper layer interposed between two layers of a dielectric material, an array of patterns made of the dielectric material, each pattern being in the shape of a greek cross, the arms of adjacent patterns being collinear, the ratio of the width to the length of each arm being in the range from 0.3 to 0.6, and the distance separating the opposite ends of arms of adjacent patterns being shorter than 10 nm.

According to an embodiment, the thickness of the copper layer is in the range from 50 to 500 nm.

According to an embodiment, the optical index of the dielectric material is in the range from 1.3 to 2.3.

According to an embodiment, the first dielectric material is silicon nitride.

According to an embodiment, the arm length is in the range from 70 to 195 nm.

According to an embodiment, the distance is in the range from 3 to 7 nm.

According to an embodiment, the ratio is in the range from 0.35 to 0.55.

Another embodiment provides an image sensor comprising, inside and on top of a semiconductor layer portion, at least one first pixel intended to receive visible light and at least one second pixel intended to receive infrared light, each first pixel being topped with a visible light bandpass plasmonic filter and each second pixel being topped with an infrared high-pass plasmonic filter such as mentioned hereabove.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

Figure 1A:
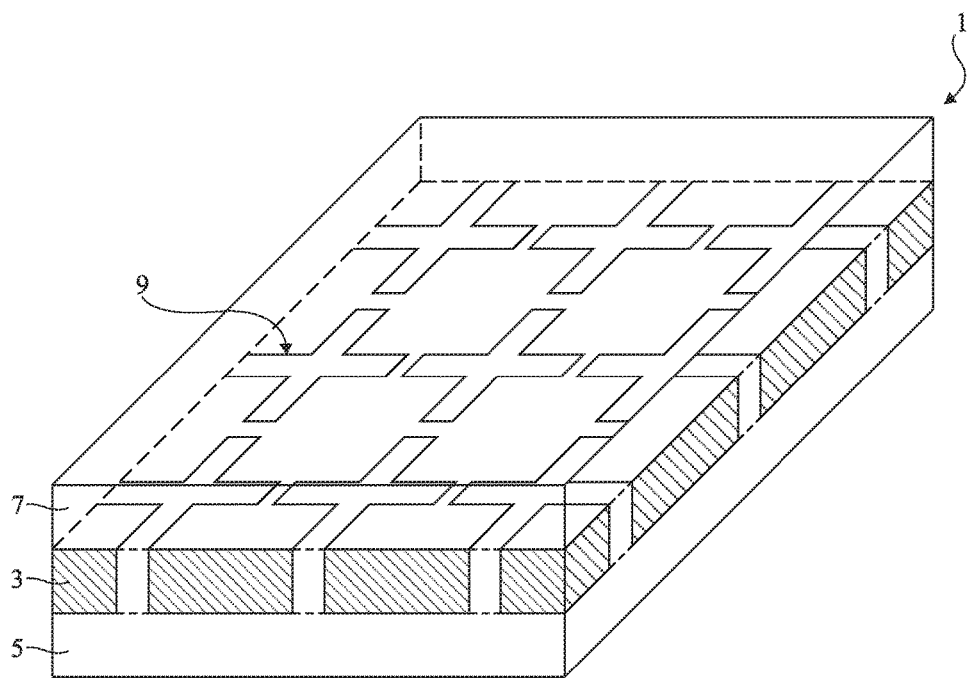
FIGS. 1A and 1B schematically show an embodiment of an infrared high-pass plasmonic filter.

The same elements have been designated with the same reference numerals in the various drawings which are, further, not to scale. For clarity, only those elements which are useful to the understanding of the described embodiments have been shown and are detailed.

In the following description, terms "upper" and "lower" refer to the orientation of the concerned elements in the corresponding drawings. Unless otherwise specified, expression "in the order of" and terms "substantially" and "approximately" mean to within 10%, preferably to within 5%.

Figure 1B:
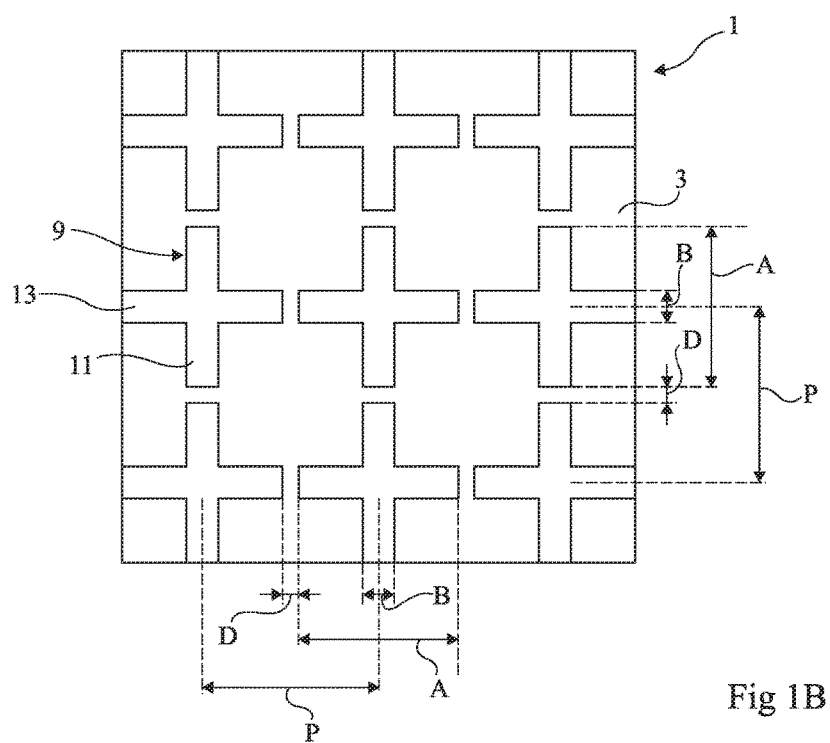

FIGS. 1A and 1B schematically show a portion of an infrared high-pass plasmonic filter. FIG. 1A is a perspective cross-section view and FIG. 1B is a top view.

Filter 1 comprises a copper layer 3 interposed between two layers 5 and 7 of a dielectric material (not shown in FIG. 1B). Copper layer 3 is crossed through its entire thickness by patterns 9, preferably made of the same dielectric material as layers 5 and 7. Each pattern 9 has the shape of a greek cross, that is, of a cross comprising two orthogonal arms 11 and 13, respectively of length A and of width B, the two arms crossing at their centers to define four branches substantially having the same dimensions. Patterns 9 are periodically arranged in layer 3, according to a period P, to form an array of patterns 9 where arms 11 of the patterns 9 of a same column are collinear and arms 13 of the patterns 9 of a same row are collinear. Thus, arms 11 of adjacent patterns 9 of a same column have opposite ends and arms 13 of adjacent patterns 9 of a same row have opposite ends. In other words, arms 11 and 13 are respectively aligned with other arms 11 and 13. A distance D, equal to period P minus length A of arms 11 and 13, separates the opposite ends of arms 11 and 13 of adjacent patterns 9.

It has been previously seen that a plasmonic filter comprising cross-shaped patterns made of a dielectric material in a metal layer such as described in patent application WO 2010/029097 is of bandpass type.

The inventors have shown that the filter of FIGS. 1A and 1B may be an infrared high-pass filter under the following conditions:

metal layer 3 is made of copper and preferably has a thickness in the range from 50 to 500 nm, the optical index of the dielectric material of layers 5 and 7 and of patterns 9 is preferably in the range from 1.3 to 2.3, distance D is smaller than or equal to 10 nm, and ratio B/A of width B of the arms to their length A is in the range from 0.3 to 0.6.

The fact for layer 3 to be a copper layer is a characteristic of the filter described herein. Indeed, the absorption of copper, particularly of copper plasmons, is strong in the visible range and low in infrared.

The above-mentioned conditions necessary for the filter of FIGS. 1A and 1B to be an infrared high-pass filter will now be explained in relation with FIGS. 2 to 5. These drawings show curves illustrating the influence of parameters A, B, D, and P and of optical index n of the dielectric material of patterns 9 and of layers 5 and 7 on the normalized transmission rate of a filter of the type in FIGS. 1A and 1B. Unless otherwise mentioned, the filters used to obtain the curves of FIGS. 2 to 5 have patterns 9 and layers 5 and 7 made of silicon nitride, a copper layer 3 having a thickness equal to 150 nm, a period P equal to 150 nm, and arms 11 and 13 having a width B equal to 65 nm and a length A equal to 145 nm.

Figure 2:
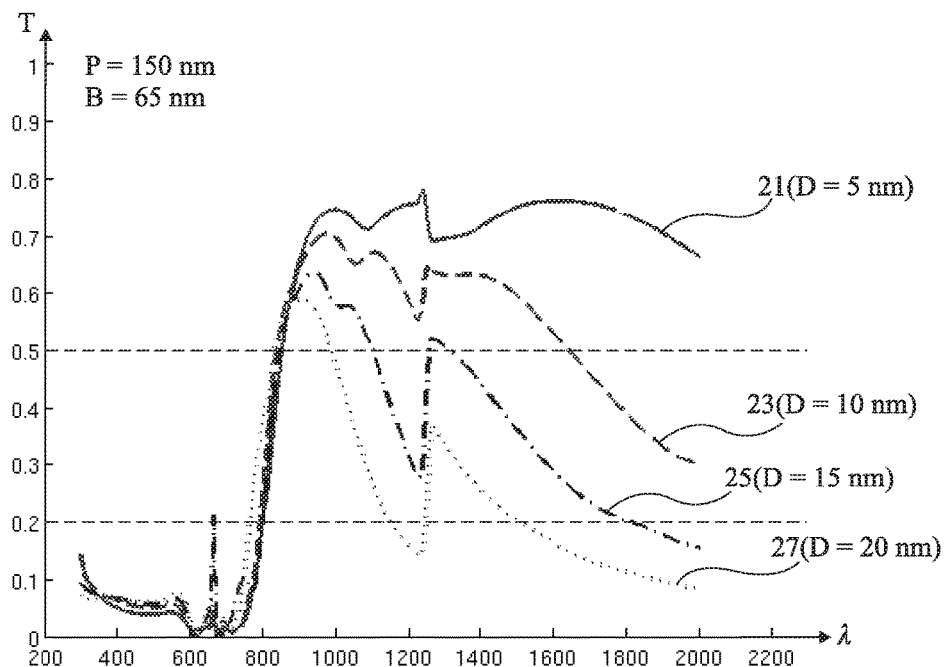
FIGS. 2 to 5 illustrate the normalized transmission rate according to the wavelength for filters of the type in FIGS. 1A and 1B.

FIG. 2 shows four curves 21, 23, 25, and 27 illustrating, for plasmonic filters of the type in FIGS. 1A and 1B, normalized transmission rate T according to wavelength λ for various values of distance D.

Curve 21 corresponds to a filter where D=5 nm (A=145 nm and B/A=0.45). For wavelengths in the range from 380 to 780 nm, normalized transmission rate T is lower than 0.2. From a wavelength substantially equal to 800 nm, T becomes greater than 0.5. This wavelength corresponds to the cut-off wavelength of the filter. For wavelengths greater than the cut-off wavelength, T is greater than 0.6. In particular, between 900 nm and 2,000 nm, T is substantially equal to 0.75.

Curve 23 corresponds to a filter where D=10 nm (A=135 nm and B/A=0.48). Like the filter of curve 21, the filter of curve 23 has a normalized transmission rate T smaller than 0.2 for wavelengths in the range from 380 to 780 nm, and a cut-off wavelength substantially equal to 800 nm. However, T only remains greater than 0.5 for wavelengths between the cut-off wavelength and approximately 1,700 nm. More particularly, between approximately 900 and 1,500 nm, T is greater than 0.6.

Curve 25 corresponds to a filter where D=15 nm (A=125 nm and B/A=0.52). Normalized transmission rate T is greater than 0.5 for a wavelength range from 850 to 1,100 nm only, and, for most wavelengths greater than 1,100 nm, T is smaller than 0.4.

Curve 27 corresponds to a filter where D=20 nm (A=115 nm and B/A=0.56). The filter of curve 27 has a normalized transmission rate T greater than 0.5 for a wavelength range from 850 to 1,000 nm only and, for most wavelengths greater than 1,000 nm, T is smaller than 0.3.

Thus, a filter of the type in FIGS. 1A and 1B forms an infrared high-pass filter when D is smaller than or equal to 10 nm (curves 23 and 21), preferably, when D is in the order of 5 nm (curve 21). However, a filter of the type in FIGS. 1A and 1B is not an infrared high-pass filter when D is greater than 10 nm (curves 25 and 27).

Figure 3:
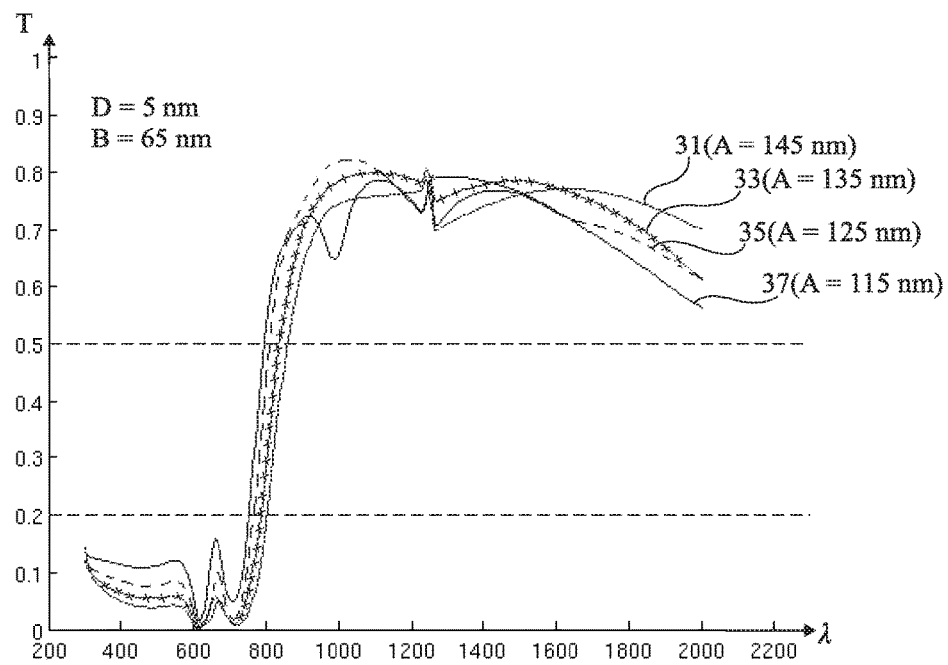

FIG. 3 shows four curves 31, 33, 35, and 37 illustrating, for plasmonic filters of the type in FIGS. 1A and 1B, normalized transmission rate T according to wavelength λ for various lengths A or arms 11 and 13. More particularly, curves 31, 33, 35, and 37 correspond to filters where length A is equal to 145 nm, 135 nm, 125 nm, and 115 nm respectively, period P is equal to 150 nm, 140 nm, 130 nm, and 120 nm, respectively, and ratio B/A is equal to 0.45, 0.48, 0.52, and 0.56, respectively. As shown in FIG. 3, curves 33, 35, and 37 have substantially the same shape as curve 31, which corresponds to curve 21 of FIG. 2.

Thus, in a filter of the type in FIGS. 1A and 1B, the length of arms 11 and 13 of patterns 9 has little or no influence on the response of the filter, which remains of infrared high-pass type in the above-mentioned conditions.

Figure 4:
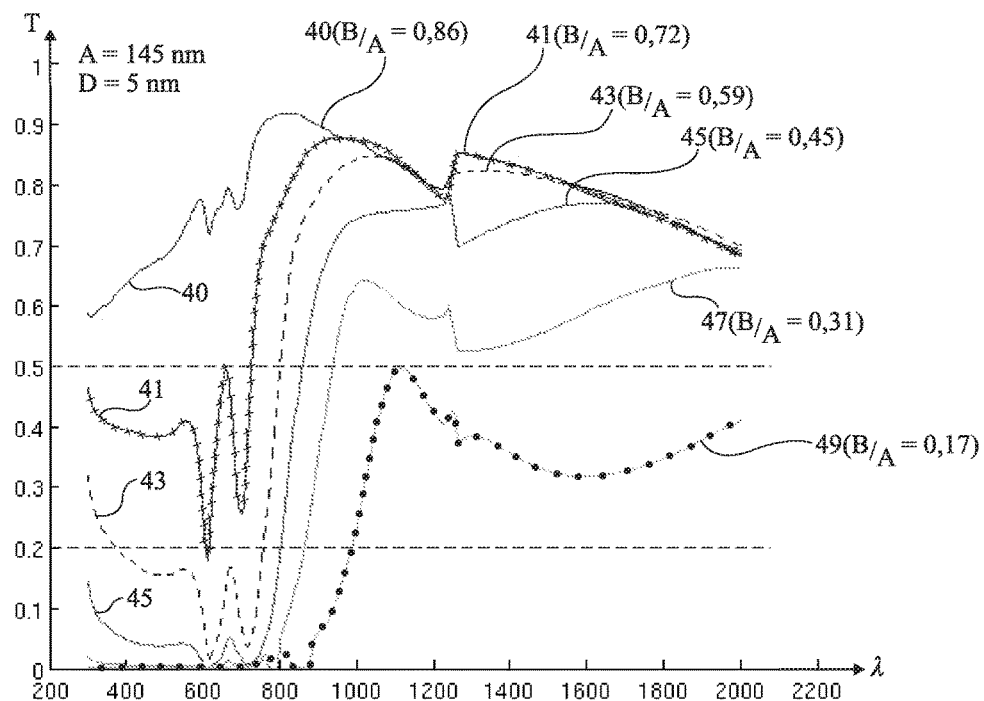

FIG. 4 shows six curves 40, 41, 43, 45, 47, and 49 illustrating, for plasmonic filters of the type in FIGS. 1A and 1B, normalized transmission rate T according to wavelength λ for various values of ratio B/A of width B to length A of arms 11 and 13 of cross-shaped patterns 9. Curves 40, 41, 43, 45, 47 correspond to filters where ratio B/A is equal to 0.86, 0.72, 0.59, 0.45, 0.31, and 0.17, respectively, that is, here, width B of arms 11 and 13 is equal to 125 nm, 105 nm, 85 nm, 65 nm, 45 nm, and 25 nm, respectively.

The filters corresponding to curves 40 and 41 (B/A greater than 0.6) have respective normalized transmission rates greater than 0.6 and greater than 0.3 for wavelengths smaller than 700 nm. These filters thus enable a large portion of the received visible light to pass.

The filter corresponding to curve 49 (B/A smaller than 0.3) has a normalized transmission rate T smaller than 0.5 for wavelengths greater than 1,000 nm. The filter thus blocks a large portion of the received infrared light and is not adapted to a use as an infrared high-pass filter.

The filters corresponding to curves 43, 45, and 47, for which B/A is respectively equal to 0.59, 0.45, and 0.31, form infrared high-pass filters. More particularly, for the filter corresponding to curve 43, normalized transmission rate T is smaller than 0.2 between approximately 380 and 750 nm, the cut-off wavelength is approximately 780 nm, and T is substantially constant and equal to 0.8 between 800 and 2,000 nm. The filter corresponding to curve 45 is the same as the filter corresponding to curve 21 of FIG. 2, and curves 45 and 21 are similar. For the filter corresponding to curve 47, T is smaller than 0.1 between approximately 380 and 750 nm, the cut-off wavelength is approximately 850 nm, and T is substantially constant and equal to 0.55 between 850 and 2,000 nm.

Thus, a filter of the type in FIGS. 1A and 1B forms an infrared high-pass filter when ratio B/A is in the range from 0.3 to 0.6, this filter having better features when B/A is in the range from 0.35 to 0.55, for example, equal to 0.45 (curve 45). It can further be observed that the cut-off wavelength of such a filter increases when ratio B/A decreases.

Figure 5:
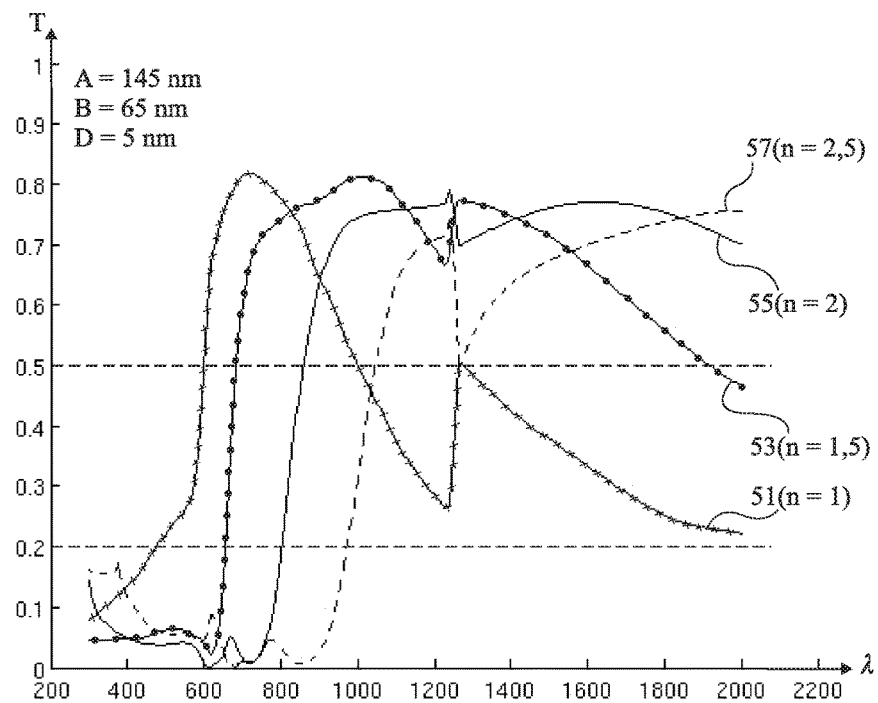

FIG. 5 shows four curves 51, 53, 55, and 57 illustrating, for plasmonic filters of the type in FIGS. 1A and 1B, normalized transmission rate T according to wavelength λ for various values of optical index n of the dielectric material of patterns 9 and of layers 5 and 7. Curves 51, 53, 55, and 57 correspond to filters for which optical index n of this material is equal to 1, 1.5, 2, and 2.5, respectively, the filter corresponding to curve 55 being the same as that corresponding to curve 21 of FIG. 2.

The filter corresponding to curve 51 has a 600-nm cut-off wavelength, but a normalized transmission rate T smaller than 0.5 for infrared wavelengths higher than 900 nm.

The filter corresponding to curve 57 has a cut-off wavelength of approximately 1,000 nm. Normalized transmission rate T of this filter is greater than 0.5 for wavelengths higher than the cut-off wavelength. However, T is strongly variable for wavelengths higher than the cut-off wavelength.

The filter corresponding to curve 53 has a cut-off wavelength of approximately 700 nm, a normalized transmission rate T smaller than 0.2 for wavelengths smaller than the cut-off wavelength, and a rate T greater than 0.5 for wavelengths between the cutoff wavelength and 1,900 nm. The filter is thus adapted to a use as an infrared high-pass filter.

The filter corresponding to curve 55 has a cut-off wavelength of approximately 800 nm, a normalized transmission rate T smaller than 0.2 for wavelengths smaller than the cut-off wavelength, and a rate T greater than 0.6 for wavelengths higher than the cut-off wavelength.

Thus, for a filter of the type in FIGS. 1A and 1B to form an infrared high-pass filter, a dielectric material having an optical index n in the range from 1.3 to 2.3 is preferably selected. Silicon nitride having an optical index n substantially equal to 2 may be selected as a dielectric material.

As an example of dimensions, in an infrared high-pass filter of the type in FIGS. 1A and 1B:

the thickness of copper layer 3 is in the range from 50 to 500 nm, for example, equal to 150 nm, period P may be in the range from 75 to 200 nm, for example, equal to 150 nm, for D equal to 5 nm, length A of arms 11 and 13 may be in the range from 70 to 195 nm, for example, equal to 145 nm, and width B of the arms may be in the range from 45 to 85 nm, for example, equal to 65 nm, when A is equal to 145 nm, and from 35 to 65 nm, for example, 45 nm, when A is equal to 110 nm.

More particularly, among the different studied filters, the filter forming the best infrared high-pass filter is that of curves 21, 31, 45, and 55 of FIGS. 2, 3, 4, and 5, respectively. In such a filter:

the dielectric material of patterns 9 and of curves 5 and 7, for example, silicon nitride, has an optical index in the range from 1.3 to 2.3, with B of arms 11 and 13, for example, equal to 65 nm when length A is equal to 145 nm, is such that ratio B/A is in the range from 0.35 to 0.55, and distance D is in the order of 5 nm, that is, in the range from 3 to 7 nm.

The plasmonic filter of FIGS. 1A and 1B may be formed by a damascene method. A layer of dielectric material having a thickness corresponding to that of layer 5 plus that of patterns 9 is formed. This layer is etched at the locations where copper layer 3 is desired to be formed. Copper is deposited and then removed all the way to the dielectric material by planarizing etching to leave in place copper layer 3 with a planar surface. Layer 7 of the dielectric material is then deposited.

An example of application of a plasmonic filter of the type in FIGS. 1A and 1B will now be described.

Figure 6:
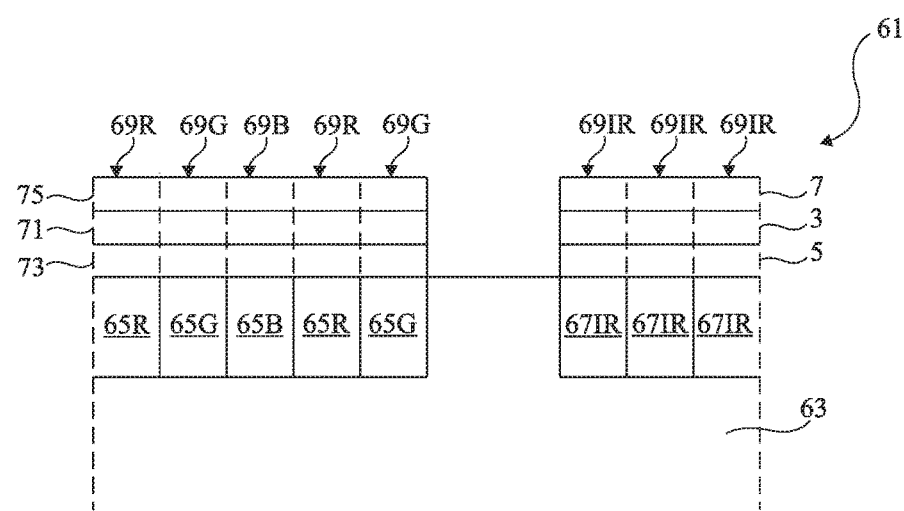
FIG. 6 schematically shows an example of a device comprising a filter of the type in FIGS. 1A and 1B.

FIG. 6 is a cross-section view schematically showing an example of an image sensor comprising an infrared high-pass plasmonic filter of the type in FIGS. 1A and 1B.

Image sensor 61 comprises, inside and on top of a portion of a semiconductor layer 63, for example, a silicon substrate, an array 65 of pixels 65R, 65G, 65B intended to receive visible light, and an array 67 of pixels 67IR intended to receive infrared light. Pixels 65R, 65G, and 65B are for example intended to receive visible light, respectively red, green, and blue, and may be arranged in a Bayer pattern. Although, in this example, pixel array 65 and pixel array 67 are separate, the two pixel array 65 and 67 may also form one and the same array, where pixels 67IR can then be regularly distributed between pixels 65R, 65G, and 65B. Each pixel 65R, 65G, 65B, and 67IR is topped with a filter 69R, 69G, 69B, and 69IR, respectively. Filters 69R, 69G, 69B may be plasmonic band-pass filters, for example, filters of the type in patent application WO 2010/029097, capable of passing visible light, for example, respectively red, green, and blue light. Filters 69R comprise a metal layer 71 interposed between two layers 73 and 75 of a dielectric material, metal layer 71 being crossed through its entire thickness by a hole filled with the dielectric material, with the possibility of periodically repeating the hole in metal layer 71. Filters 69G, 69B are for example similar to filters 69R, with the difference that the hole dimensions are selected according to the light passed by the filters. Filters 69IR are plasmonic filters of the type in FIGS. 1A and 1B, each comprising a copper layer 3 interposed between two layers 5 and 7 of a dielectric material and a periodic cross-shaped pattern extending through the entire thickness of copper layer 3. The dimensions of the patterns and period P of repetition of the patterns are selected so that filters 69IR form infrared high-pass filters.

In operation, the image sensor receives light on the side of the surface of the semiconductor layer coated with filters 69R, 69G, 69B, and 69IR.

As an example, metal layer 71 may be made of aluminum, of gold, of silver, or of copper. In the case where layer 71 is made of copper, layers 71 and 3 may correspond to portions of a same copper layer. The dielectric material of layers 73 and 75 may be different from that of layers 5 and 7, for example, silicon oxide. The dielectric material of layers 73 and 75 may also be the same as that of layers 5 and 7. In this last case, layers 73 and 5 may correspond to portions of a same layer, and/or layers 7 and 75 may correspond to portions of a same layer.

Thus, only red light crosses filters 69R and reaches pixels 65R. In the same way, only blue light reaches pixels 65B, only green light reaches pixels 65G, and only red light reaches pixels 67IR.

An advantage of such a sensor is that the pixels intended to receive visible light and the pixels intended to receive infrared light are formed inside and on top of a same semiconductor layer portion, that is, inside and on top of a same integrated circuit chip.

Another advantage of the sensor is that the infrared high-pass filter is not made of black resin, which simplifies the manufacturing steps of this infrared filter. In particular, manufacturing steps requiring thermal treatments at temperatures higher than 250° C. may be carried out after filters 69IR have been manufactured. Further, it is possible to delimit infrared filters 69IR on small surfaces corresponding to pixels 67IR, which especially enables, when pixels 67IR are regularly arranged among pixels 65R, 65G, and 65B, to simplify the manufacturing of filters 69IR as compared with the case where black resin is used.

Another advantage of the sensor is that filters 69R, 69B, 69G, and 69IR are manufactured by successive steps of etching and depositing metal and insulating layers currently used in CMOS technologies. Further, when filters 69R, 69G, 69B, and 69IR are made of the same materials, the latter may be simultaneously manufactured, which simplifies the sensor manufacturing method.

Specific embodiments have been described. Various alterations, modifications, and improvements will occur to those skilled in the art. In particular, it will be within the abilities of those skilled in the art to adapt the dimensions of patterns 9 and of layers 3, 5, and 7, the material of layers 5 and 7, and period P, to modify the cut-off wavelength, rate T in the visible range, rate T for wavelengths greater than the cut-off wavelength, and the extension of the wavelength range where the filter is transparent (T greater than or equal to 0.5).

The previously-described infrared high-pass plasmonic filter may be used in an image sensor which only comprises pixels intended to receive infrared light, or more generally in other devices where an infrared high-pass filtering is desired to be achieved.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. An infrared high-pass plasmonic filter, comprising:
a copper layer interposed between two layers of a dielectric material;
an array of patterns made of the dielectric material, each pattern being in the shape of a greek cross, with arms of adjacent patterns being collinear;
wherein a ratio (B/A) of a width (B) to a length (A) of each arm is in a range from 0.3 to 0.6, and wherein a distance (D) separating opposite ends of arms of adjacent patterns being shorter than 10 nm.

2. The plasmonic filter of claim 1, wherein a thickness of the copper layer is in a range from 50 to 500 nm.

3. The plasmonic filter of claim 1, wherein an optical index of said dielectric material is in a range from 1.3 to 2.3.

4. The plasmonic filter of claim 1, wherein the dielectric material is silicon nitride.

5. The plasmonic filter of claim 1, wherein the length (A) of the arms is in a range from 70 to 195 nm.

6. The plasmonic filter of claim 1, wherein said distance (D) is in a range from 3 to 7 nm.

7. The plasmonic filter of claim 1, wherein said ratio (B/A) is in a range from 0.35 to 0.55.

8. An image sensor, comprising:
a semiconductor layer portion including, inside and on top of said semiconductor layer portion, at least one first pixel configured to receive visible light and at least one second pixel configured to receive infrared light;
wherein each first pixel includes a visible light bandpass plasmonic filter; and
wherein each second pixel includes an infrared high-pass filter, said infrared high-pass filter comprising:
a copper layer interposed between two layers of a dielectric material;
an array of patterns made of the dielectric material, each pattern being in the shape of a greek cross, with arms of adjacent patterns being collinear;
wherein a ratio (B/A) of a width (B) to a length (A) of each arm is in a range from 0.3 to 0.6, and wherein a distance (D) separating opposite ends of arms of adjacent patterns being shorter than 10 nm.

9. The image sensor of claim 8, wherein a thickness of the copper layer is in a range from 50 to 500 nm.

10. The image sensor of claim 8, wherein an optical index of said dielectric material is in a range from 1.3 to 2.3.

11. The image sensor of claim 8, wherein the dielectric material is silicon nitride.

12. The image sensor of claim 8, wherein the length (A) of the arms is in a range from 70 to 195 nm.

13. The image sensor of claim 8, wherein said distance (D) is in a range from 3 to 7 nm.

14. The image sensor of claim 8, wherein said ratio (B/A) is in a range from 0.35 to 0.55.

15. An infrared high-pass plasmonic filter, comprising:
a copper layer interposed between two layers of a dielectric material, said copper layer including an array of openings extending through the copper layer and filled with said dielectric material;
wherein said openings are in a cross shape formed by two arms having a same length (A) and a same width (B);
wherein the two arms perpendicularly intersect each other;
wherein the arms of adjacent openings in the array are collinear but separated by a distance (D) less than 10 nm; and
wherein a ratio (B/A) of the width (B) to the length (A) of each arm is in a range from 0.3 to 0.6.

16. The plasmonic filter of claim 15, wherein a thickness of the copper layer is in a range from 50 to 500 nm.

17. The plasmonic filter of claim 15, wherein an optical index of said dielectric material is in a range from 1.3 to 2.3.

18. The plasmonic filter of claim 15, wherein the length (A) of the arms is in a range from 70 to 195 nm.

19. The plasmonic filter of claim 15, wherein said distance (D) is in a range from 3 to 7 nm.

20. The plasmonic filter of claim 15, wherein said ratio (B/A) is in a range from 0.35 to 0.55.

* * * * *